US008698658B1

(12) United States Patent
Ghatak

(10) Patent No.: US 8,698,658 B1
(45) Date of Patent: Apr. 15, 2014

(54) APPARATUS, METHOD AND SYSTEM FOR CANCELLING AN INPUT-REFERRED OFFSET IN A PIPELINE ADC

(71) Applicant: LSI Corporation, Milpitas, CA (US)

(72) Inventor: Kalyan Ghatak, San Jose, CA (US)

(73) Assignee: LSI Corporation, San Jose, CA (US)

( * ) Notice: Subject to any disclaimer, the term of this patent is extended or adjusted under 35 U.S.C. 154(b) by 0 days.

(21) Appl. No.: 13/658,854

(22) Filed: Oct. 24, 2012

(51) Int. Cl.
H03M 1/06 (2006.01)

(52) U.S. Cl.
USPC .......................................... 341/118; 341/161

(58) Field of Classification Search
USPC .................. 341/118, 120, 155, 144, 172, 161
See application file for complete search history.

(56) References Cited

U.S. PATENT DOCUMENTS

| 5,479,130 | A | * | 12/1995 | McCartney | .................... | 327/341 |
| 5,929,799 | A |  | 7/1999 | Rothenberg |  |  |
| 6,369,744 | B1 |  | 4/2002 | Chuang |  |  |
| 7,009,548 | B2 |  | 3/2006 | Chiang et al. |  |  |
| 7,009,549 | B1 | * | 3/2006 | Corsi | ............................. | 341/161 |
| 7,042,373 | B2 |  | 5/2006 | Tsai et al. |  |  |
| 7,071,856 | B2 |  | 7/2006 | Tsai et al. |  |  |
| 7,170,439 | B1 | * | 1/2007 | Chen | ............................. | 341/172 |
| 7,265,705 | B1 |  | 9/2007 | Lee et al. |  |  |
| 7,280,064 | B2 |  | 10/2007 | Lin |  |  |
| 7,683,819 | B2 | * | 3/2010 | Kurauchi | ....................... | 341/172 |
| 7,924,062 | B2 | * | 4/2011 | Chiu | ............................. | 327/94 |
| 2009/0295477 | A1 |  | 12/2009 | Dasgupta |  |  |
| 2011/0095930 | A1 |  | 4/2011 | Buter et al. |  |  |

* cited by examiner

Primary Examiner — Peguy Jean Pierre
(74) Attorney, Agent, or Firm — Kermit D. Lopez; Luis M. Ortiz; Ortiz & Lopez, PLLC

(57) ABSTRACT

An apparatus, method and system for offset compensation in a pipeline analog-to-digital converter. A group of capacitors includes one or more sampling capacitors and one or more feedback capacitors, wherein an input to the pipeline analog-to-digital converter circuit is connected to group of capacitors. An amplifier includes a non-inverting input terminal connected to a ground and an inverting input connected to the group of capacitors. The sampling and feedback capacitors are both partitioned in the same ratio to form partitioned capacitors such that a smaller of the partitioned capacitors is employed for offset compensation with respect to the pipeline analog-to-digital converter.

17 Claims, 4 Drawing Sheets

APPARATUS, METHOD AND SYSTEM FOR CANCELLING AN INPUT-REFERRED OFFSET IN A PIPELINE ADC

TECHNICAL HELD

Embodiments are generally related to ADC (Analog-to-Digital Converter) circuits and components. Embodiments are also related to pipeline ADC and MDAC (Multiplying Digital-to-Analog converters) and related circuits and components thereof.

BACKGROUND OF THE INVENTION

A pipeline analog-to-digital converter (ADC) generally includes a number of stages that are connected in a series configuration. The pipeline ADC 10 shown in FIG. 1 generally includes a stage 12, which provides an output signal that is input to the next stage 14, which in turn provides an output signal that is input to a following stage 16.

A 1.5 bits-per-stage architecture is a commonly used design for the pipeline ADC stages. Each stage can include a sub-ADC, a digital-to-analog converter (DAC), and a gain stage as shown FIG. 1. The sub-ADC 18 is connected to a DAC 20, which in turn provides an output that can be combined with the input 26 (whose value is referred to as $V_{IN}$ in FIG. 1). The resulting combination (see block 21) is applied as input to a gain stage 22, which provides an output (whose value is referred to as $V_{OUT}$ in FIG. 1).

The DAC and gain stage are often combined into a single common structure referred to as a multiplying digital-to-analog converter (MDAC). A single-ended switched-capacitor circuit implementation of the 1.5 bits-per-stage MDAC is depicted in FIG. 2 as circuit 30. As shown in FIG. 2, the circuit 30 generally includes an input 33 (whose value is referred to as $V_{IN}$, and which is equivalent to $V_{OUT}$ from the previous stage) electrically connected to switches 32 and 34. Circuit 30 additionally includes a switch 36 that is electrically connected to the switch 34 and to a capacitor 40 (whose value is referred to as $C_2$ in FIG. 2). The switch 32 is electrically connected to a capacitor 38 (whose value is referred to as $C_1$ in FIG. 2) and to another switch 35. Both capacitors 38 and 40 are electrically connected to the inverting input of an amplifier 44. The non-inverting input of the amplifier 44 is electrically connected to a voltage 42 (whose value is referred to as $V_{OS}$ in FIG. 2), which in turn is connected to ground. The voltage 42 represents the offset voltage of the amplifier in the circuit 30. The output 46 of the amplifier (whose value is referred to as $V_{OUT}$ in FIG. 2, and is also equivalent to $V_{IN}$ for the next stage) is also connected to the switch 35.

$\Phi_1$ and $\Phi_2$ are two non-overlapping clocks. In FIG. 2, the switches 32 and 34 are closed when the clock $\Phi_1$ goes to a high value, while the switches 35 and 36 are closed when the clock $\Phi_2$ goes to a high value. The capacitor 38 can be considered as the feedback capacitor and the capacitor 40 can be regarded as the sampling capacitor. During the sampling phase, when $\Phi_1$ is high, the input signal $V_{IN}$ is sampled onto the bottom plates of the two capacitors 38 and 40. The charge stored on the capacitors at the end of the sampling phase is:

$$Q_S=(C_1+C_2)(V_{IN}-V_{OS}) \quad [1]$$

During the next phase, called the amplification phase, when $\Phi_2$ is high, the capacitor 38 is switched into feedback around the amplifier and the bottom plate of the capacitor 40 is connected to a reference voltage whose value is referred to as $V_{REF}$ in FIG. 2. The charge stored on the capacitors at the end of the amplifying phase is:

$$Q_A=C_1(V_{OUT}-V_{OS})+C_2(V_{REF}-V_{OS}) \quad [2]$$

Using the principle of charge conversion at the amplifier's inverting input, $$Q_S=Q_A \quad [3]$$

Therefore, $$V_{OUT}=\left(1+\frac{c_2}{c_1}\right)V_{IN}-\frac{c_2}{c_1}V_{REF} \quad [4]$$

If both capacitors are equal valued, i.e., $C_1=C_2=C$, the above equation can be rewritten as:

$$V_{OUT}=2V_{IN}-V_{REF} \quad [5]$$

The above equation demonstrates that the amplifier's offset does not affect the functionality of the MDAC if the standard 1.5 bits-per-stage architecture is used as shown. However, to reduce power consumption in pipeline ADCs, the amplifier can be shared between adjacent stages and is used by a stage only during its amplification phase, as shown in FIG. 3.

FIG. 3 illustrates a schematic diagram of a 1.5 bits-per-stage MDAC circuit 51 that employs amplifier sharing between adjacent stages. Circuit 51 represents the stage during the sampling phase 52 and the amplification phase 60. The sampling phase 52 involves the use of capacitors 56 and 58, which are arranged in parallel to one another. The capacitors 56 and 58 are connected to ground and also to an input voltage whose value is referred to as $V_{IN}$ in FIG. 3. The input voltage is equivalent to the output voltage from the previous stage, whose value is referred to as $V_{OUT}$. The amplification phase 60 includes an amplifier 68 in which the offset voltage 66 (whose value is referred to as $V_{OS}$ in FIG. 3) is applied to the non-inverting input terminal of the amplifier 60. A capacitor 62 is electrically connected to a reference voltage whose value is referred to as $V_{REF}$ and to the inverting input terminal of the amplifier 68 and further to a capacitor 64. The capacitor 64 is further tied to the output 70 (whose value is referred to as $V_{OUT}$ in FIG. 3) of the amplifier 68.

In reality, when the stage changes from the sampling phase 52 to the amplification phase 60, the capacitor 56 in the sampling phase becomes the capacitor 64 in the amplification phase. Therefore, the capacitors 56 and 64 are the same and their value is referred to as $C_1$ in FIG. 3. Similarly, the capacitors 58 and 62 are the same and their value is referred to as $C_2$ in FIG. 3.

During the sampling phase, the input voltage is sampled onto the capacitors 56 and 58. The charge stored on the capacitors at the end of the sampling phase is:

$$Q_S=(C_1+C_2)V_{IN} \quad [6]$$

During the amplification page, the amplifier is introduced into the circuit as shown in FIG. 3. The charge stored on the capacitors as the end of the amplifying phase is:

$$Q_A=C_1(V_{OUT}-V_{OS})+C_2(V_{REF}-V_{OS}) \quad [7]$$

Using the principle of charge conversion at the amplifier's inverting input terminal, $$Q_S=Q_A \quad [8]$$

Therefore, $$V_{OUT} = \left(1 + \frac{C_2}{C_1}\right)V_{IN} - \frac{C_2}{C_1}d_i V_{REF} + \left(1 + \frac{C_2}{C_1}\right)V_{OS} \quad [9]$$

If $C_1=C_2=C$, the above equation can be rewritten as:

$$V_{OUT}=2V_{IN}-V_{REF}+2V_{OS} \quad [10]$$

The output voltage is now influenced by the amplifier's offset voltage. As the signal travels down the pipeline stages, the offset of the amplifier in each stage is similarly added along. This leads to a shift in the ADC's input-output transfer curve as shown in FIG. 4 and impacts applications where absolute conversion accuracy is required. FIG. 4 illustrates a graph 72 that represents data indicating shift in the input-output curve due to offset error in an ADC.

BRIEF SUMMARY

The following summary is provided to facilitate an understanding of some of the innovative features unique to the disclosed embodiments and is not intended to be a full description. A full appreciation of the various aspects of the embodiments disclosed herein can be gained by taking the entire specification, claims, drawings, and abstract as a whole.

It is, therefore, one aspect of the disclosed embodiments to provide for an improved ADC.

It is another aspect of the disclosed embodiments to provide devices, methods, and systems for offset compensation in a pipeline ADC.

The aforementioned aspects and other objectives and advantages can now be achieved as described herein. An apparatus, method, and system are disclosed for offset compensation in a pipeline analog-to-digital converter. A group of capacitors includes one or more sampling capacitors and one or more feedback capacitors, wherein an input to the pipeline analog-to-digital converter circuit is connected to a group of capacitors. An amplifier includes a non-inverting input terminal connected to ground and an inverting input connected to the group of capacitors. The sampling and feedback capacitors are both partitioned in the same ratio to form partitioned capacitors such that a smaller of the partitioned capacitors is employed for offset compensation with respect to the pipeline analog-to-digital converter.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION

The particular values and configurations discussed in these non-limiting examples can be varied and are cited merely to illustrate at least one embodiment and are not intended to limit the scope thereof.

Figure 5:
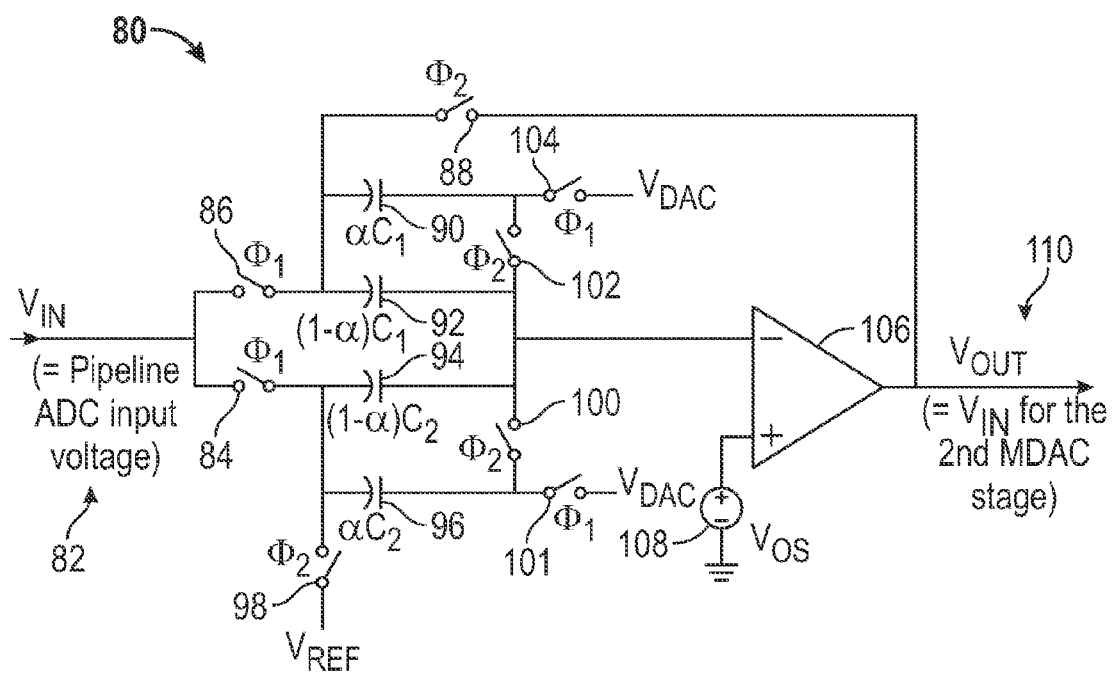
FIG. 5 illustrates a schematic diagram of single-ended representation of a 1.5 bits-per-stage MDAC circuit that allows offset compensation in a pipeline ADC, in accordance with the disclosed embodiments.

FIG. 5 illustrates a schematic diagram of a single-ended representation of a 1.5 bits-per-stage MDAC circuit 80 that enables offset compensation in a pipeline ADC that employs amplifier sharing between adjacent stages, in accordance with the disclosed embodiments. Circuit 80 represents the first stage of a pipeline ADC. It generally includes the input voltage 82 (whose value is referred to as $V_{IN}$ in FIG. 5) to the pipeline ADC that is electrically connected to switches 84 and 86. Switch 86 is electrically connected to a switch 88 and to capacitors 90 and 92. Switch 84 is similarly electrically connected to a switch 98 and capacitors 94 and 96. Switch 98 is further electrically connected to a reference voltage whose value is referred to as $V_{REF}$ in FIG. 5. The capacitors 92 and 94 are both connected to switches 100 and 102 and also to the inverting input terminal of the amplifier 106.

The capacitor 90 is also connected to switches 104 and 102, while the capacitor 96 is connected to switches 100 and 101. The switches 104 and 101 are also connected to a voltage level whose value is referred to as $V_{DAC}$ in FIG. 5. This voltage can be supplied by a DAC that is employed for offset compensation but is not shown in the illustration. The non-inverting input terminal of the amplifier 106 is connected to a voltage source 108 (whose value is referred to as $V_{OS}$ in FIG. 5) that represents the offset voltage of the amplifier 106. The output 110 (whose value is referred to as $V_{OUT}$ in FIG. 5) is also tied to the switch 88. The output 110 becomes the input for the following second stage in the pipeline ADC.

The configuration depicted in FIG. 5 demonstrates a method for compensating the input-referred offset of a Pipeline ADC. The feedback capacitor 38 from FIG. 2 can be split into 2 capacitors in FIG. 5, i.e., a smaller capacitor 90 and a larger capacitor 92. If the smaller feedback capacitor 90 has a capacitance of $\alpha C_1$ where $0<\alpha<0.5$, then the larger feedback capacitor 92 has a capacitance of value $(1-\alpha)C_1$. Similarly, the sampling capacitor 40 from FIG. 2 can be split into 2 capacitors in FIG. 5, a smaller capacitor 96 and a larger capacitor 94. If the smaller sampling capacitor 96 has a capacitance of $\alpha C_2$, where $0<\alpha<0.5$, then the larger sampling capacitor 94 has a capacitance of value $(1-\alpha)C_2$. Finally, $\Phi_1$ and $\Phi_2$ are two non-overlapping clocks.

Figure 6:
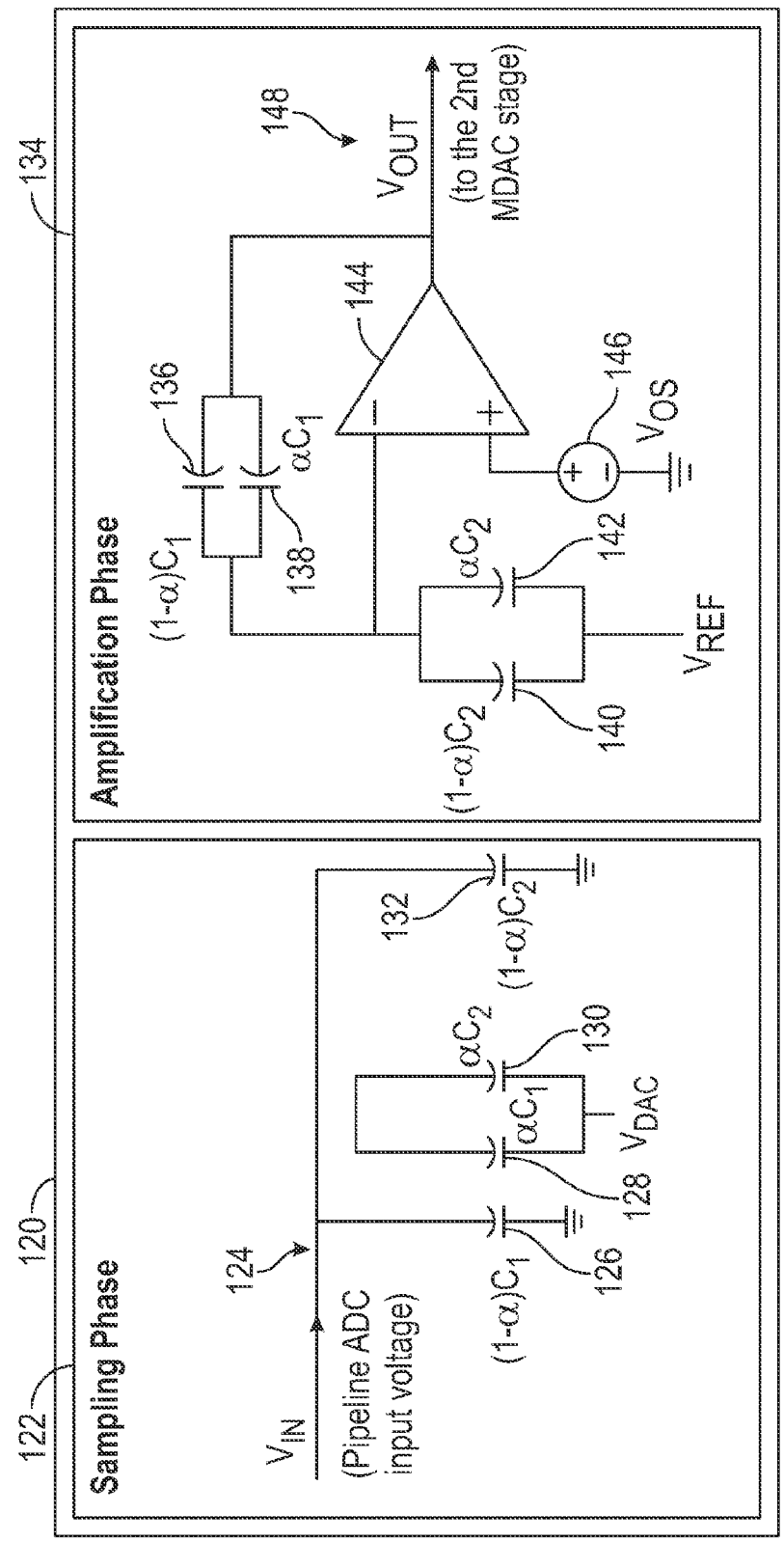
FIG. 6 illustrates a schematic diagram representing the sampling and amplification phases of a single-ended 1.5 bits-per-stage MDAC circuit for offset compensation that uses amplifier sharing between adjacent stages, in accordance with the disclosed embodiments.

FIG. 6 illustrates a schematic diagram of the sampling and amplification phases of a single-ended 1.5 bits-per-stage MDAC circuit 120 that enables offset compensation, in accordance with the disclosed embodiments, in a pipeline ADC that employs the offset compensation method illustrated in circuit 80. The circuit 120 represents the stage during the sampling phase 122 and during the amplification phase 134. The sampling phase 122 includes the use of capacitors 126, 128, 130, and 132, which are supplied with an input voltage 124 (whose value is referred to as $V_{IN}$ in FIG. 6) to the pipeline ADC. Capacitors 128 and 130 are further connected to the voltage $V_{DAC}$. The amplification phase 134 includes a capacitor 140 in parallel with capacitor 142, and a capacitor 138 in parallel with capacitor 136. Capacitors 140, 142 are connected to the reference voltage (whose value is referred to as $V_{REF}$ in FIG. 6) and to the inverting input terminal of the amplifier 144. Similarly, capacitors 136 and 138 are also connected to the inverting input of the amplifier 144 and to the output of the amplifier, whose value is referred to as $V_{OUT}$ in FIG. 6. The non-inverting input terminal of the amplifier 144 is connected to a voltage source 146 (whose value is referred to as $V_{OS}$ in FIG. 6) that represents the offset voltage of the amplifier 144.

In reality, when the circuit in FIG. 6 changes from the sampling phase 122 to the amplification phase 134, the capacitor 126 in the sampling phase becomes the capacitor 136 in the amplification phase. Therefore, the capacitors 126 and 136 are the same and their value is referred to as $(1-\alpha)C_1$ in FIG. 6. Furthermore, capacitors 126 and 136 are equivalent to the capacitor 92 in FIG. 5. Similarly, the capacitors 128 and 138 in FIG. 6 are the same and their value is referred to as $\alpha C_1$, and they are both equivalent to the capacitor 90 in FIG. 5. In addition, the capacitors 130 and 142 in FIG. 6 are the same and their value is referred to as $\alpha C_2$, and they are both equivalent to the capacitor 96 in FIG. 5. Finally, the capacitors 132 and 140 in FIG. 6 are the same and their value is referred to as $(1-\alpha)C_2$, and they are both equivalent to the capacitor 94 in FIG. 5.

As shown in FIG. 6, during the sampling phase, $\Phi_1$ is high and the input voltage is sampled onto the capacitors 126, 128, 130, and 132. The charge stored on the capacitors at the end of the sampling phase is:

$$Q_S = (1-\alpha)(C_1 + C_2)V_{IN} + \alpha(C_1 + C_2)(V_{IN} - V_{DAC}) \quad [11]$$
$$= (C_1 + C_2)V_{IN} - \alpha(C_1 + C_2)V_{DAC}$$

During the amplification phase, when $\Phi_2$ is high, both feedback capacitors, 136 and 138, are switched into feedback around the amplifier. At the same time, both sampling capacitors, 140 and 142, are connected between the reference voltage and the amplifier's inverting input terminal. The charge stored on the capacitors at the end of the amplifying phase is:

$$Q_A = (1-\alpha C_1 + \alpha C_1)(V_{OUT} - V_{OS}) + (1-\alpha C_2 + \alpha C_2)(V_{REF} - V_{OS}) \quad [12]$$
$$= C_1(V_{OUT} - V_{OS}) + C_2(V_{REF} - V_{OS})$$

Using the principle of charge conversion at the amplifier's inverting input terminal, $$Q_S = Q_A \quad [13]$$

Therefore, $$V_{OUT} = \left(1 + \frac{c_2}{c_1}\right)V_{IN} - \frac{c_2}{c_1}V_{REF} + \left(1 + \frac{c_2}{c_1}\right)(V_{OS} - \alpha V_{DAC}) \quad [14]$$

while $V_{OS}$ represents the offset voltage of the stage, it can also be considered to represent the effective input-referred voltage of the pipeline ADC. Since the transfer function of the 1.5 bits-per-stage MDAC is linear, the effect of the offsets of the amplifiers in the MDAC stages can be modeled as a single offset voltage at the non-inverting input terminal of the amplifier of the first-stage MDAC. If $V_{OS,AMPLIFIER1}$ represents the offset of the amplifier in the first-stage MDAC, $V_{OS,AMPLIFIER2}$ represents the offset of the amplifier in the second-stage MDAC and so on, then input-referred offset of the pipeline ADC, $V_{OS,ADC}$, can be represented as, $$V_{OS,ADC} = V_{OS,Amplifier_1} + \frac{1}{2}V_{OS,Amplifier_2} + \frac{1}{2^2}V_{OS,Amplifier_3} + \frac{1}{2^3}V_{OS,Amplifier_4} + \cdots \quad [15]$$

Therefore, if $V_{OS}$ in equation (14) is substituted by $V_{OS,ADC}$ from equation (15), the method of offset compensation can be extended to the entire ADC.

From equation (14), the offset of the pipeline ADC can be compensated by setting:

$$\left(1 + \frac{c_2}{c_1}\right)(V_{OS,ADC} - \alpha V_{DAC}) = 0 \quad [16]$$

Therefore, $$V_{DAC} = \frac{V_{OS,ADC}}{\alpha} \quad [17]$$

when $V_{DAC}$ is set to the above value, the transfer function of the MDAC stage is equivalent to that of an offset-free MDAC stage, and the offset of the ADC can be compensated. $V_{DAC}$ can be established in different ways. For example, the input of the pipeline ADC can be set to the common-mode input voltage and the value of $V_{DAC}$ can be changed until the output of the pipeline ADC reaches its mid-code value, thereby indicating a zero differential input voltage and the corresponding ADC output.

The capacitor-splitting feature referenced above can be derived from the standard 1.5 bits-per-stage architecture by considering that current design engineering and physical layout practices involve building a capacitor as a parallel combination of smaller unit-sized capacitors. Consequently, the capacitors can be grouped such that the smaller-sized set is driven by $V_{DAC}$ and employed for offset compensation. For example, a 100 fF capacitor can be designed as a parallel combination of four 25 fF capacitors. If one 25 fF capacitor is used for offset compensation, then, as per FIG. 5, $$C_1 = 100 \text{ fF}$$
$$\alpha C_1 = 25 \text{ fF} \quad [18]$$

Therefore, $\alpha = 0.25$. Such an arrangement leads to the following equation for offset compensation.

$$V_{DAC} = \frac{V_{OS}}{0.25} \quad [19]$$

Figure 1:
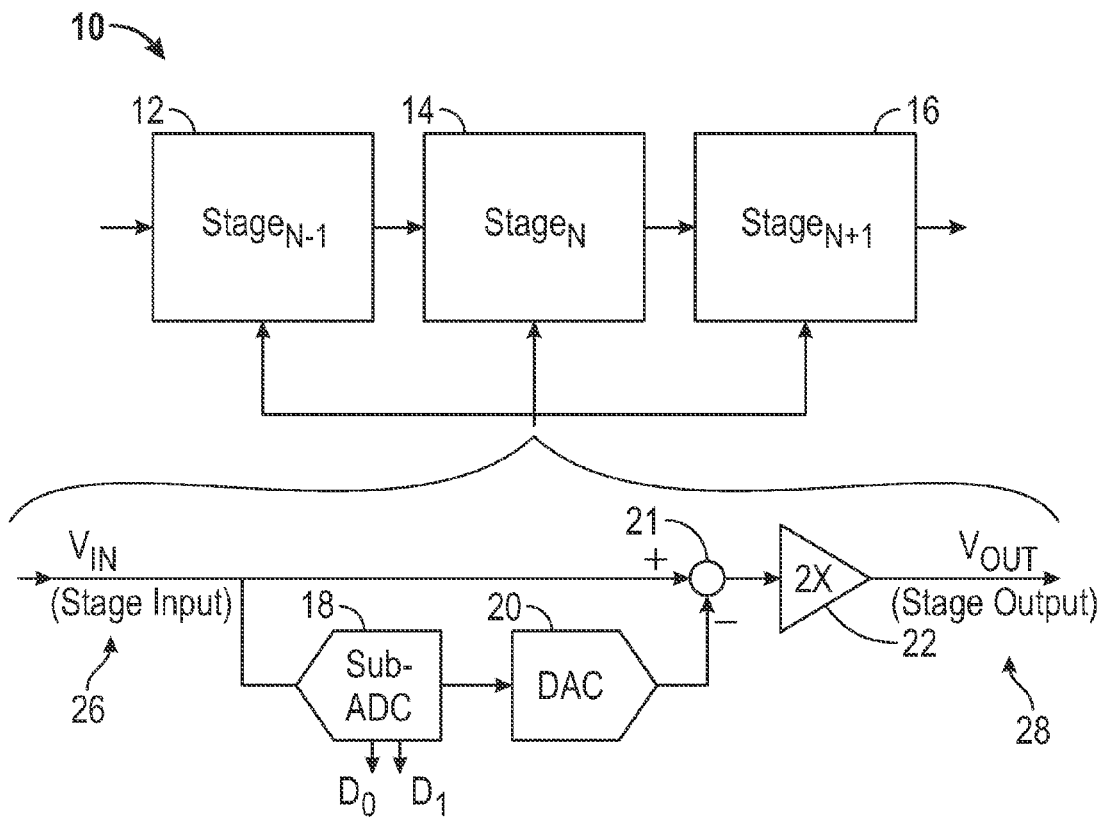
FIG. 1 illustrates a schematic diagram of a pipeline ADC with 1.5 bits-per-stage architecture.
Figure 2:
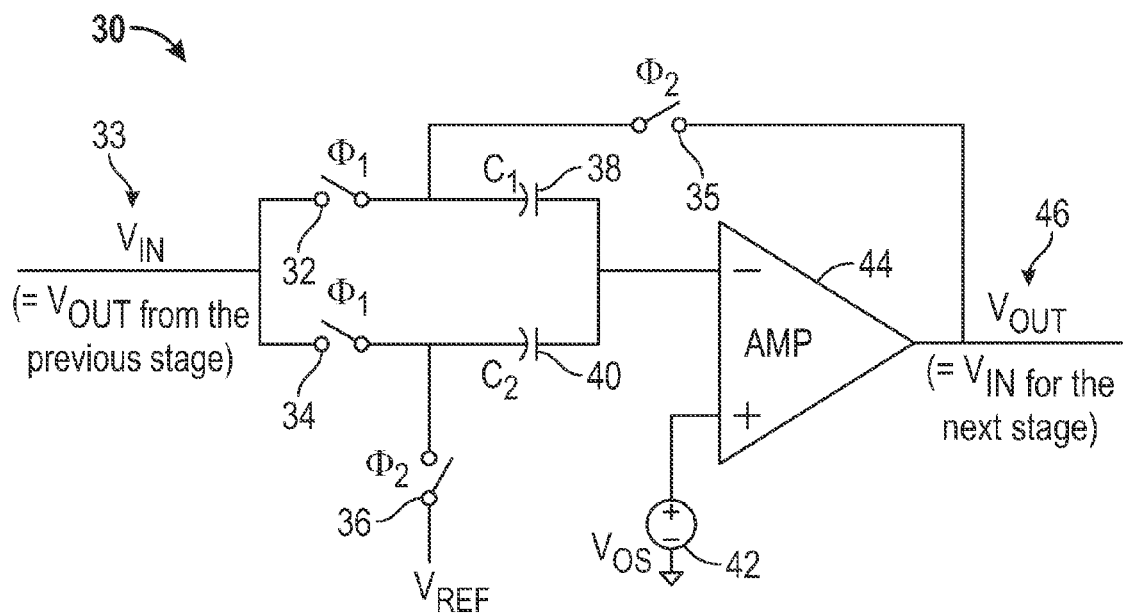
FIG. 2 illustrates a schematic diagram of a circuit for implementing a 1.5 bits-per-stage architecture in a single-ended manner.
Figure 3:
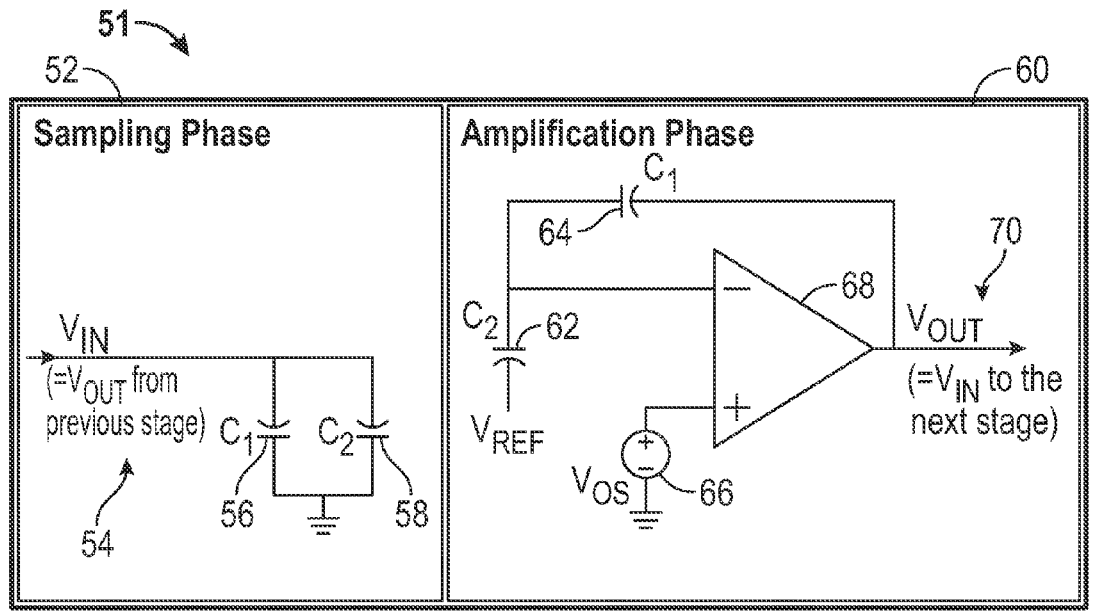
FIG. 3 illustrates a schematic diagram of a 1.5 bits-per-stage MDAC circuit that uses amplifier sharing between adjacent stages.
Figure 4:
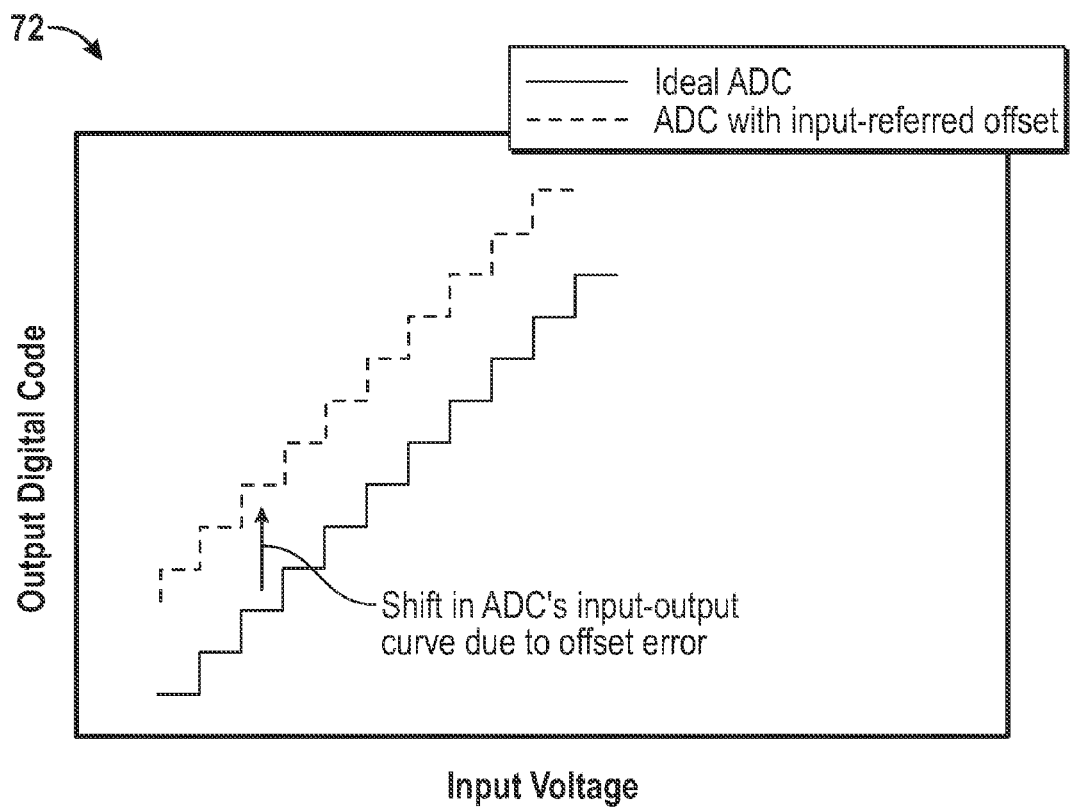
FIG. 4 illustrates a graph that represents data indicating a shift in the input-output curve due to offset error in an ADC.

Since the offset-compensation scheme shown in FIG. 5 is essentially derived from and similar to the standard 1.5 bits-per-stage circuit shown in FIG. 2, the proposed offset compensation scheme presents the same capacitive load at the input of the pipeline ADC and has the same feedback factor as the standard 1.5 bits-per-stage architecture.

The offset-compensation scheme shown in FIG. 5 also retains the KT/C noise properties of the standard 1.5 bits-percycle architecture that is depicted in FIG. 2. During the sampling phase of the proposed offset compensation technique indicated in FIG. 6, the input sampling capacitance is $$C_{SAMPLING} = \{(1-\alpha)C_1 + \alpha C_1\} + \{(1-\alpha)C_2 + \alpha C_2\} = C_1 + C_2 \quad [20]$$

Therefore, the thermal noise of the capacitors in the MDAC is given by $$\overline{v_n^2} = \frac{k_B T}{c_1 + c_2} \quad [21]$$

where $k_B$ refers to the Boltzmann constant and T refers to the operating temperature of the circuit. As shown in equation [21] above, the thermal noise voltage on the capacitor's noise remains the same as the standard 1.5 bits-per-stage implementation shown in FIG. 2.

It will be appreciated that variations of the above-disclosed and other features and functions, or alternatives thereof, may be desirably combined into many other different systems or applications. Also, that various presently unforeseen or unanticipated alternatives, modifications, variations or improvements therein may be subsequently made by those skilled in the art which are also intended to be encompassed by the following claims.

What is claimed is:

1. An apparatus for offset compensation in a pipeline analog-to-digital converter, said apparatus comprising:
    a plurality of capacitors including at least one sampling capacitor and said at least one feedback capacitor, wherein an input to said pipeline analog-to-digital converter circuit is connected to said plurality of capacitors; and
    an amplifier having a non-inverting input terminal connected to a ground and an inverting input connected to said plurality of capacitors, wherein said at least one sampling capacitor and said at least one feedback capacitor are both partitioned in a same ratio to form partitioned capacitors such that a smaller of said partitioned capacitors is employed for offset compensation with respect to said pipeline analog-to-digital converter.

2. The apparatus of claim 1 further comprising an external digital-to-analog converter that supplies a voltage $V_{DAC}$ such that:

$$V_{DAC} = \frac{V_{OS}}{\alpha}$$

wherein $V_{OS}$ represents an input-referred offset of said pipeline analog-to-digital converter and $\alpha$ represents said same ratio to form said partitioned capacitors such that said apparatus compensates for an offset associated with said pipeline analog-to-digital converter.

3. The apparatus of claim 2 wherein partitioning to form said partitioned capacitors is performed on said at least one sampling capacitor and said at least one feedback capacitor of a standard 1.5 bits-per-stage multiplying digital-to-analog converter, thereby enabling said offset compensation.

4. The apparatus of claim 3 wherein input loading and capacitor noise are similar to that of said 1.5 bits-per-stage multiplying digital-to-analog converter.

5. The apparatus of claim 1 wherein partitioning to form said partitioned capacitors is performed on said at least one sampling capacitor and said at least one feedback capacitor of a standard 1.5 bits-per-stage multiplying digital-to-analog converter.

6. The apparatus of claim 1 wherein said input to said pipeline analog-to-digital converter circuit is responsive to an input signal.

7. A method for offset compensation in a pipeline analog-to-digital converter, said method comprising:
    configuring a plurality of capacitors to include at least one sampling capacitor and said at least one feedback capacitor;
    connecting an input to said pipeline analog-to-digital converter circuit to said plurality of capacitors;
    providing an amplifier having a non-inverting input terminal connected to a ground and an inverting input connected to said plurality of capacitors; and
    partitioning said at least one sampling capacitor and said at least one feedback capacitor in a same ratio to form partitioned capacitors such that a smaller of said partitioned capacitors is employed for offset compensation with respect to said pipeline analog-to-digital converter.

8. The method of claim 7 further comprising providing an external digital-to-analog converter that supplies a voltage $V_{DAC}$ such that:

$$V_{DAC} = \frac{V_{OS}}{\alpha}$$

wherein $V_{OS}$ represents an input-referred offset of said pipeline analog-to-digital converter and $\alpha$ represents said same ratio to form said partitioned capacitors such that said apparatus compensates for an offset associated with said pipeline analog-to-digital converter.

9. The method of claim 8 wherein partitioning to form said partitioned capacitors is performed on said at least one sampling capacitor and said at least one feedback capacitor of a standard 1.5 bits-per-stage multiplying digital-to-analog converter.

10. The method of claim 9 wherein input loading and capacitor noise are similar to that of said 1.5 bits-per-stage multiplying digital-to-analog converter.

11. The method of claim 7 wherein partitioning to form said partitioned capacitors is performed on said at least one sampling capacitor and said at least one feedback capacitor of a standard 1.5 bits-per-stage multiplying digital-to-analog converter.

12. The method of claim 7 wherein said input to said pipeline analog-to-digital converter circuit is responsive to an input signal, 13. A system for offset compensation in a pipeline analog-to-digital converter, said system comprising:
    a pipeline analog-to-digital converter;
    a plurality of capacitors including at least one sampling capacitor and said at least one feedback capacitor, wherein an input to said pipeline analog-to-digital converter circuit is connected to said plurality of capacitors and is responsive to an input signal; and
    an amplifier having a non-inverting input terminal connected to a ground and an inverting input connected to said plurality of capacitors, wherein said at least one sampling capacitor and said at least one feedback capacitor are both partitioned in a same ratio to form partitioned capacitors such that a smaller of said partitioned capacitors is employed for offset compensation with respect to said pipeline analog-to-digital converter.

14. The system of claim 13 further comprising an external digital-to-analog converter that supplies a voltage $V_{DAC}$ such that:

$$V_{DAC} = \frac{V_{OS}}{\alpha}$$

wherein $V_{OS}$ represents an input-referred offset of said pipeline analog-to-digital converter and $\alpha$ represents said same ratio to form said partitioned capacitors such that said apparatus compensates for an offset associated with said pipeline analog-to-digital converter.

15. The system of claim 14 wherein partitioning to form said partitioned capacitors is performed on said at least one sampling capacitor and said at least one feedback capacitor of a standard 1.5 bits-per-stage multiplying digital-to-analog converter, thereby enabling said offset compensation.

16. The system of claim 13 wherein input loading and capacitor noise are similar to that of said 1.5 bits-per-stage multiplying digital-to-analog converter.

17. The system of claim 13 wherein partitioning to form said partitioned capacitors is performed on said at least one sampling capacitor and said at least one feedback capacitor of a standard 1.5 bits-per-stage multiplying digital-to-analog converter, thereby enabling said offset compensation.

\* \* \* \* \*